United States Patent [19]
Yoshino et al.

[11] Patent Number: 5,399,211
[45] Date of Patent: * Mar. 21, 1995

[54] METHOD OF PLATING STEEL

[75] Inventors: Akira Yoshino; Masaaki Tahara; Haruo Senbokuya; Kenzo Kitano; Takakazu Tomoda, all of Osaka, Japan

[73] Assignee: Daidousanso Co., Ltd., Japan

[*] Notice: The portion of the term of this patent subsequent to Dec. 4, 2007 has been disclaimed.

[21] Appl. No.: 81,185

[22] Filed: Jun. 25, 1993

Related U.S. Application Data

[63] Continuation of Ser. No. 725,691, Jul. 3, 1991, abandoned.

[30] Foreign Application Priority Data

Nov. 30, 1990 [JP] Japan ................ 2-339661

[51] Int. Cl.6 ................................................. C23C 2/00
[52] U.S. Cl. ...................................... 148/283; 427/321; 427/433
[58] Field of Search ............... 427/321, 433; 148/283

[56] References Cited

U.S. PATENT DOCUMENTS

| | | |
|---|---|---|
| 2,121,412 | 6/1938 | Schulte . |
| 3,129,124 | 4/1964 | Barney . |
| 3,765,929 | 10/1973 | Martin . |
| 4,975,147 | 12/1990 | Tahara ................ 134/31 |

FOREIGN PATENT DOCUMENTS

| | | |
|---|---|---|
| 0352061 | 1/1990 | European Pat. Off. . |
| 152947 | 3/1987 | Germany . |
| 2153855 | 8/1985 | United Kingdom . |

Primary Examiner—Sam Silverberg
Attorney, Agent, or Firm—Armstrong, Westerman, Hattori, McLeland & Naughton

[57] ABSTRACT

Upon forming a plating coat on steel works, the works are held in a fluorine- or fluoride-containing gas atmosphere in a heated condition to thereby remove oxidized scales such as SiOx, MnOx and the like on the surface layer of the work and to form a fluoride layer to prevent forming new oxidized scale. The fluoride layer is easily eliminated by an action of added flux to a plating bath or by heating the fluorinated steel works in an atmosphere containing hydrogen prior to dipping in the plating bath to activate the steel surface. The activated steel surface is improved in compatibility with the plating bath and the like to realize a good quality plating coat formation.

2 Claims, 4 Drawing Sheets

METHOD OF PLATING STEEL

This is a continuation application of Ser. No. 07/725,691, filed Jul. 3, 1991, and now abandoned.

TECHNICAL FIELD

This invention relates to a method of plating steel.

PRIOR ART

A hot Zinc dipping and a hot Aluminum dipping are applied to various uses since a plated coat of them has an excellent rust preventive property and, since those methods require a low cost. Platings such as the hot zn dipping and the hot Aluminum dipping are conducted by precleaning the steel works, such as cleaning with acid, then heating them at 650° to 800° C. in an annealing process in a reduction atmosphere, cooling them to the vicinity of the temperature of a plating bath and then dipping them in a plating bath to form a plating coat. In such a plating process, in order to obtain a good quality plating coat, not only enough precleaning of the steel articles is required, but also it is preferable that oxidized scales such as SiOx, MnOx on the steel work surface layer are not generated in an annealing process under an atmosphere of reduction. Recently, a lot of Si is contained in the steel works since continuous casting material is used and a high strength material is required. This Si content in the steel work is changed to an oxidized scale in the annealing process in said reduction atmosphere. This presents an obstacle in forming a plating coat by causing problems such as uneven plating and bad appearance.

In order to prevent generating the oxidized scale, it is necessary not to change quality of Si and the like to the oxidized scale in the annealing process in an reduction atmosphere. Generally, however, in a conventional continuous treatment process, a reduction atmosphere is formed with a mixed gas composed of $N_2$ and $H_2$ and the above-mentioned steel materials are heated and cooled in this atmosphere. Since formation of an oxide of Si or Mn requires low energy, an oxide scale is easily formed. Therefore, it is impossible to restrain the above oxidation completely even if the reduction property is increased and even if the heating temperature is lowered. For example, in the hot Zinc dipping, a steel material containing not less than 0.5% of Si is deteriorated in plating quality since wettability of galvanizing bath is prevented due to the above oxide scale formation. In the hot Aluminum dipping, the above problem is also caused in the case having not less than 2% content of Si.

OBJECT OF THE INVENTION

Accordingly, this invention has an object to provide a method of plating steel in which a high quality plating coat is easily formed.

SUMMARY OF THE INVENTION

In order to accomplish the above-mentioned object, the method of plating according to the invention comprises holding the steel works or articles in an atmosphere of fluorine- or fluoride-containing gas and then forming a plating coat on the fluorided works.

In this invention, prior to forming a plating coat on the steels works or articles, the steel works are held in an atmosphere of fluorine- or fluoride-containing gas in a heated condition, whereby an oxidized scale such as SiOx and MnOx on the steel work surface is removed and at the same time a fluoride layer is formed so that the surface of the steel works is covered with the fluoride layer. The fluoride layer generally comprises a thin film having thickness of about several tens to several thousandsÅ and is stable at 300° C. to 600° C. and prevents newly forming an oxidized scale. Since the fluoride layer is more porous compared with the oxide layer formed at the same temperatures and has rich sublimation, it is easily removed with the action of an added flux such as chloride and/or Al in the plating bath of the next step. As for the removal of the fluorinated layer, the steel works with the fluoride layer formed thereon are introduced into an atmosphere of an inert gas containing hydrogen or an atmosphere containing moisture (water) and heated to remove the layer, prior to dipping in the above-mentioned plating bath. Since the steel surface after removing the fluoride layer is activated, its conformability with a plating bath and the like is improved to realize formation of a good quality plating coat.

This invention is described in detail below.

In this invention, steel works are charged into a heating and cooling furnace and held in an atmosphere of fluorine- or fluoride-containing gas in a heated condition, and then a plating coat is formed thereon.

Subjects to be plated are steel works. The steel works include various steel materials such as a carbon steel or stainless steel. The shape and the like of the steel works are not limited particularly. It may be in a shape of plate or sheet, coil, and screw which is processed. The steel materials used in this invention include not only a single material but also alloy which is composed of iron as a main composition and other metallic materials.

Fluorine- or fluoride-containing gas used for making a fluorine- or fluoride containing gas atmosphere means a gas in which fluorine-source component comprising either a single member selected from $NF_3$, $BF_3$, $CF_4$, HF, $SF_6$, $F_2$, $C_2F_6$, $WF_6$, $CHF_3$, $SiF_4$, and the like or a mixture thereof is contained in an inert gas such as $N_2$. In addition to the above-mentioned gasses, as the fluorine- or fluoride-containing gas, $F_2$ which is formed by decomposing compounds which include F such as $BF_3$, $CF_4$, HF, $SF_6$, $C_2F_6$, $WF_6$, $CHF_3$, $SiF_4$, with a thermal-cracking apparatus may be used. When the compound such as $BF_3$ to be cracked is used, a cracker is disposed in front of or in the vicinity of the heating and cooling furnace to thermal-crack the compound. Then the cracked and produced $F_2$ is mixed with $N_2$ and the mixture is introduced into the furnace. Fluorine- or fluoride-containing gas used in this invention include $F_2$ produced by cracking as discussed above.

Among the fluorine source components mentioned above, $NF_3$ is the most suited for practical use since it is superior in safety, reactivity, controlability, and ease of handling. A mixed gas composed of, for example, 1% $NF_3$, gas+5% $F_2$+94% $N_2$ (by weight) is also practically used. In such a fluorine- or fluoride-containing gas, concentration of a fluorine component such as NF, and the like is set 1 to 15%, preferably 2 to 7% by weight (weight standard: hereinafter the same) from the view point of efficiency. The atmosphere of fluorine- or fluoride-containing gas is formed by filling such a gas or a mixture in a predetermined space.

According to the invention, the steel material is plated, for example, as follows. A steel material heated at 650° C. to 750° C. is introduced to a cooling step and then introduced into an atmosphere of fluorine- or fluoride-containing gas and held at 300° C. to 600° C.

therein for one to eight minutes, preferably two to three minutes. By holding the steel in this atmosphere, oxides such as SiOx,. and MnOx on the surface of the steel material are eliminated and a fluoride layer is formed thereon. Then the steel material with the fluoride film formed on its surface is dipped in a plating bath such as a Zinc plating bath or an Aluminum plating bath or the like to form a plating coat. In this case, the fluorinated steel works are not dipped in the plating bath directly, but the works may be contacted with a mixed gas composed of hydrogen and nitrogen ($H_2$; 90 to 10%+$N_2$; the rest) to remove the fluoride layer and then they are dipped in the plating bath. In a batch of process, the amount of $NF_3$ to obtain a good quality plating coat is about 50g to 700g per ton of the steel material.

EXAMPLE 1

Figure 1:
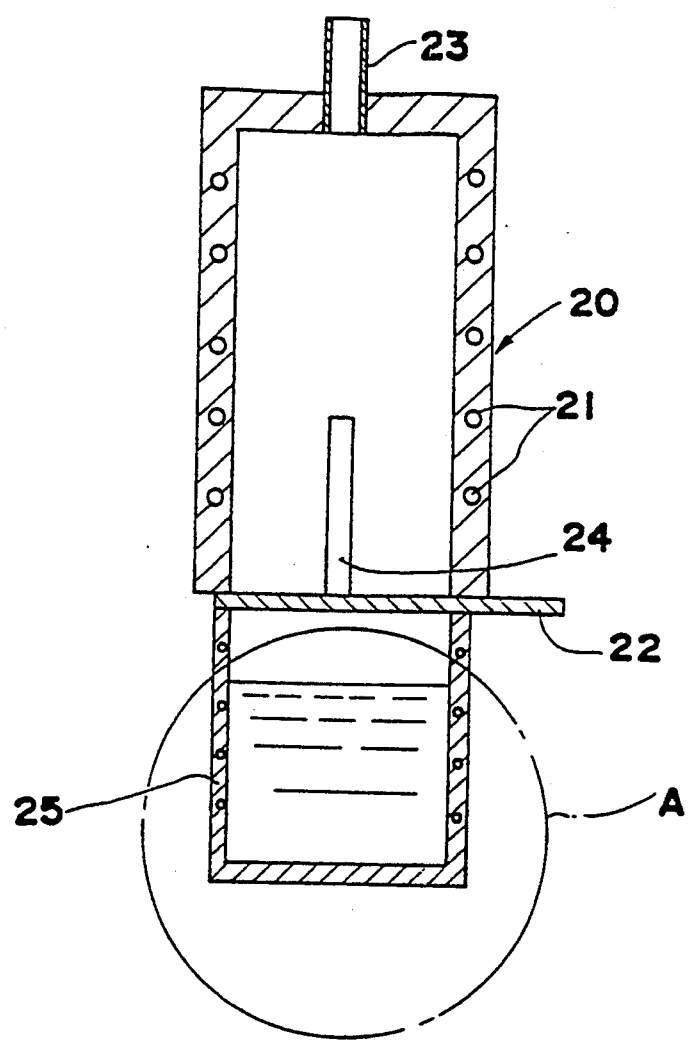
FIG. 1 shows a cross-sectional view of an example of a treatment furnace used in this invention.
Figure 2:
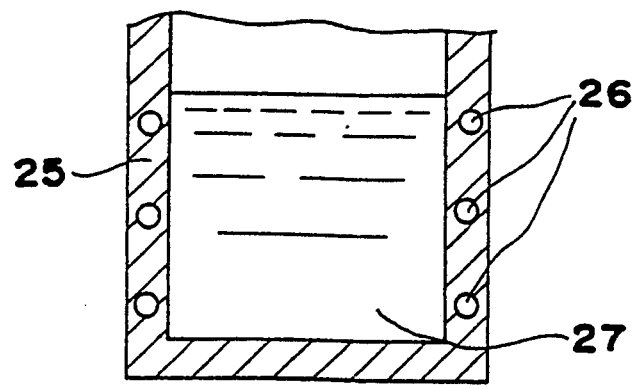
FIG. 2 shows a partially enlarged view of a part A surrounded by a circle therein.

An experimental heat treatment furnace 1 as shown in FIG. 1 was used. In the figure, reference numeral 20 is a furnace body having adiabatic walls, 21 is a heater disposed by burying in a peripheral direction of the furnace body 20 and 22 is a slidable door disposed at the bottom of the furnace body 20 and the door 22 slides in right and left direction as seen in FIG. 1. At a ceiling of the furnace body 20 is connected a conduit 23 for introducing a gas into the furnace 20. The reference numeral 24 indicates steel articles to be treated. Under the furnace 20 is disposed Zinc pot furnace 25 which is partitioned by the slidable door 22. In the Zinc pot furnace 25, an induction coil 26 is disposed by burying in surrounding walls as shown in FIG. 2, and Zinc liquid is filled therein having temperature of 480°C.

In this furnace, a few samples of steel works (cold-rolled steel material: 1% Si, 0.2% Mn) were heated to 750° C. in an $N_2$ atmosphere, then cooled to lower the temperature to 350°C., then the samples were blown a fluoride containing gas ($N_2$+5%$NF_3$) in the furnace for one minute and held therein for two to five minutes. After that, a $N_2$ gas was blown thereinto, temperature was raised to 500° C. in an $N_2$ atmosphere and then one of the samples was taken out of the furnace for an elemental analysis. The rest of the samples were transferred into the Zinc pot furnace 25 by opening the slidable door 22 and dipped in a zinc bath to galvanize them with Zn. After galvanizing with Zn, they were taken out of the furnace 25 and at the same time blown thereon with $N_2$ gas, then cooled and dried, whereby galvanized samples were obtained. After supplying the fluoride-containing gas composed of $N_2$+5% $NF_3$ into the heat treatment furnace and holding the samples for two to five minutes therein, a mixed gas composed of $N_2$+25% $H_2$ was supplied therein and under the atmosphere the samples were heated to 500° C. and held for ten minutes. Then the samples were transferred into the Zinc pot furnace 25 to galvanize them. The same galvanized samples were given as the above-mentioned.

EXAMPLE 2

Steel samples were heated to 750° C. in an $N_2$ atmosphere and then cooled to 500°C. At this temperature the samples were held in an atmosphere of fluorine- or fluoride-containing gas having same composition as in the Example 1. Except this, galvanized samples were made as well as in the Example 1.

EXAMPLE 3

A mixed gas composed of 1% $NF_3$+5% $F_2$+94% $N_2$ was used as the fluorine- or fluoride containing gas. Except that, galvanized samples were made as well as in the Example 1.

COMPARATIVE EXAMPLE

The same samples used in the Example 1 were used and they were heated at 750° C. in an $N_2$+50% $H_2$ atmosphere, then cooled to 500° C. and dipped in a zincking bath as well as in the Example 1 without fluorination,. Except this, galvanized samples were obtained as well as in the Example 1.

Figure 3:
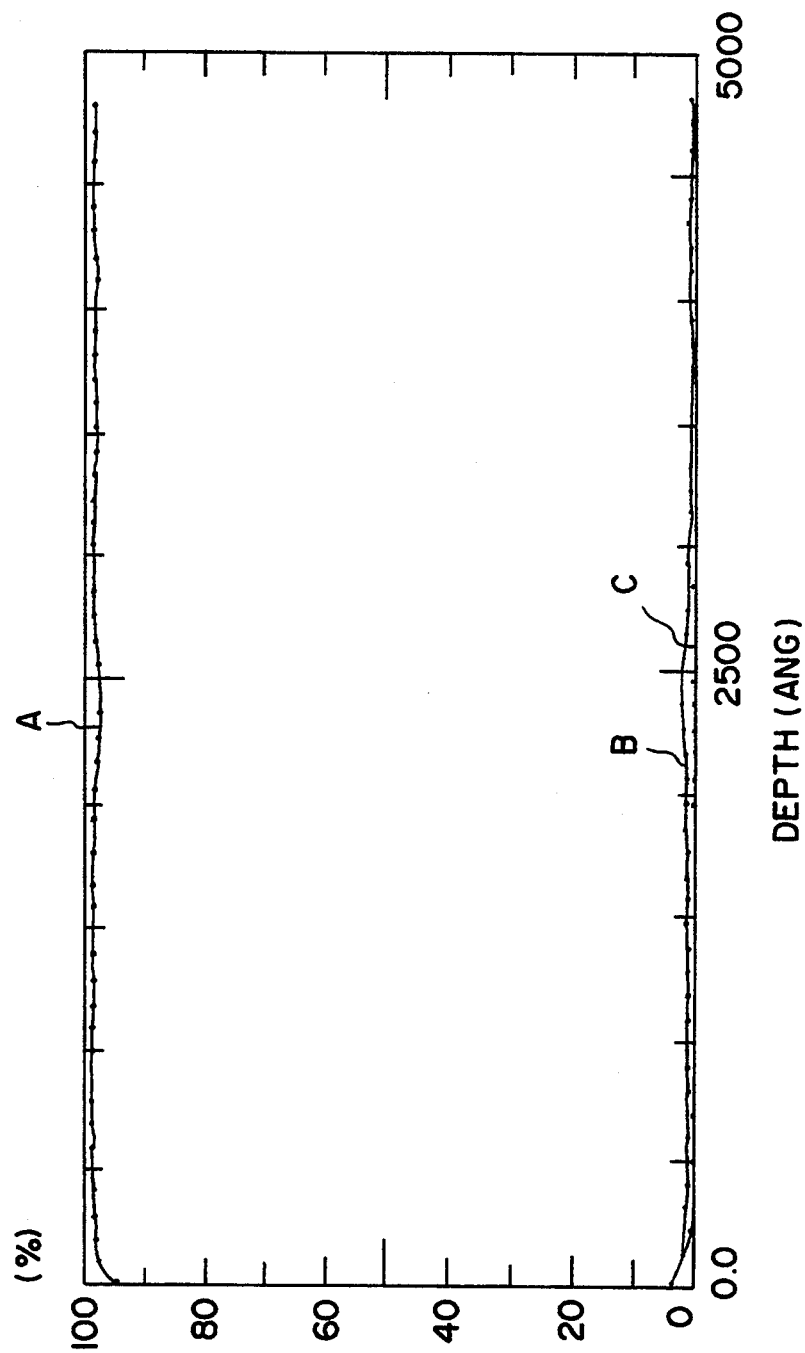
FIG. 3, 4 and 5 show depth-direction elemental analysis curves by SIMS.
Figure 4:
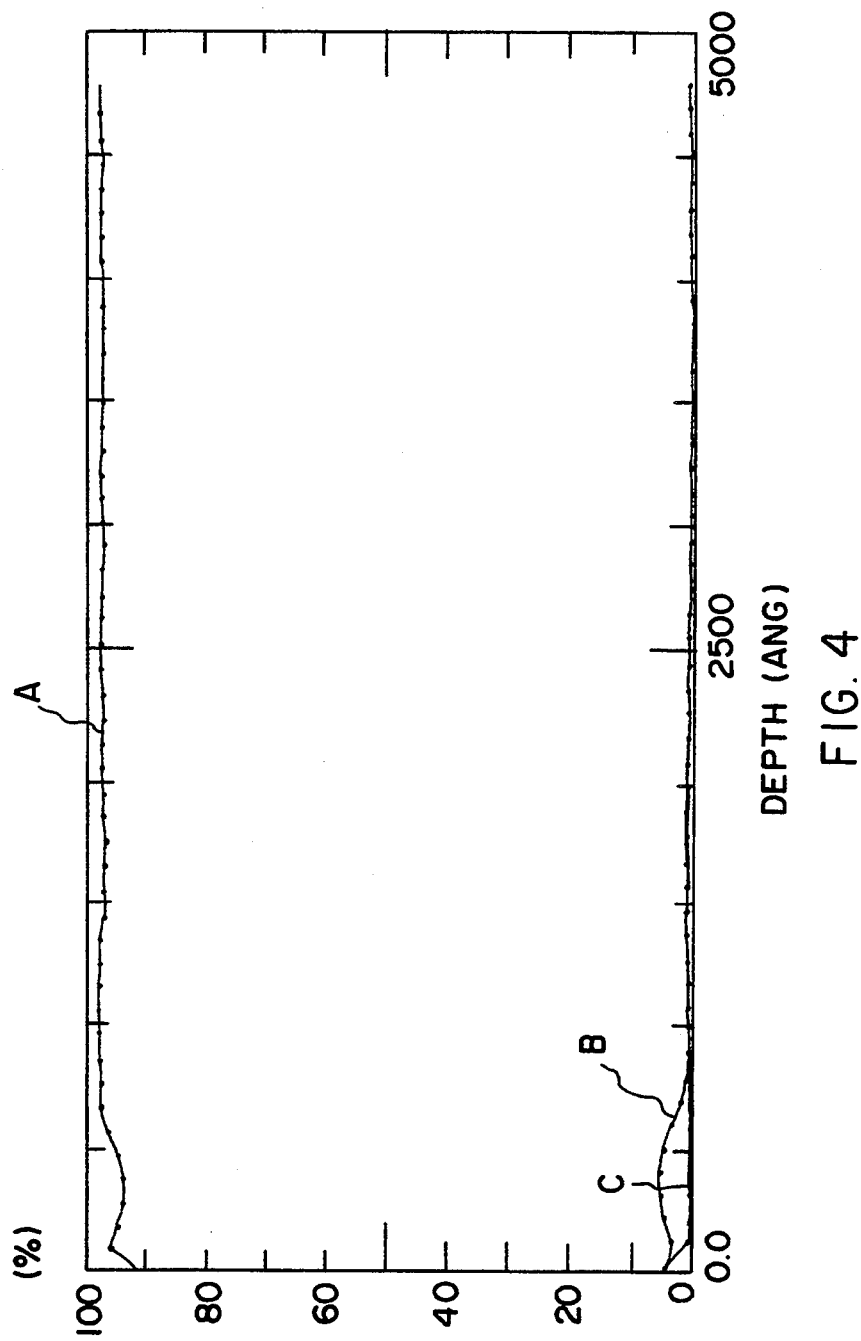
Figure 5:
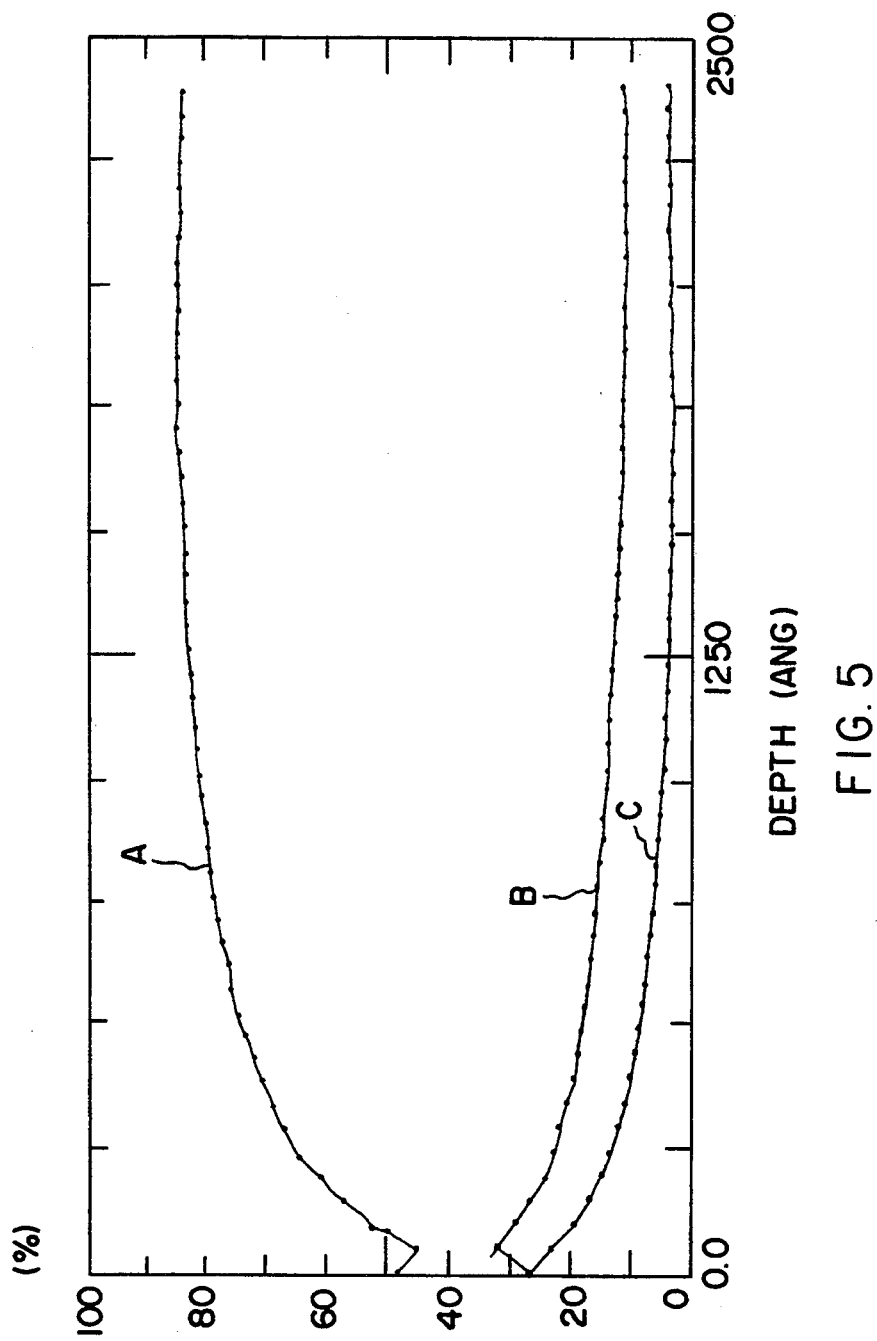

An elemental analysis in a depth direction in the outermost surface layer part was conducted by SIMS (secondary ion mass spectrometer) against an ungalvanized sample (what are in a step just before galvanizing) obtained in the Examples 1, 2 and the Comparative Example. The results were shown in FIGS. 3, 4 and 5. In these drawings, straight line A shows Fe, straight line B; Si, straight line C; Mn. The FIG. 3 corresponds to the Example 1, the FIG. 4 to the Example 2 and the FIG. 5 to the Comparative Example. That is, "concentration" of Si and/or Mn (Concentrating degree of Si and/or Mn is relatively high.) was not seen in the outermost outside surface layer part in the Examples 1 and 2 as clearly seen in FIGS. 3 and 4. On the contrary, in the Comparative Example shown in FIG. 5, oxidation of the most outside surface layer occurred to form oxides such as SiOx and MnOx on the surface layer, whereby it was seen that concentration of Si and Mn in the surface layer becomes relatively high, we define this condition as "concentration."

A bending part was examined by conducting an adhesion bending test for examining adhesiveness of a plating coat on each sample formed in the Examples and the Comparative Examples. As a result, blister of the plating coat was not seen on the bending part in the Examples 1 and 2, while that of the plating coat was largely caused on the bending part in the Comparative Example and bad adhesiveness of the plating coat was observed. The sample obtained in the Example 3 showed the same structure and the same plating coat properties as those obtained in the Example 1.

It is obvious from the above-mentioned results that it is possible, according to the invention, to conduct a high quality plating such as a hot zinc dipping of high Si containing steel materials to which it was, in particular, hard to plate conventionally, and that it is also possible to produce a steel sheet or a steel plate which needs high strength. In addition, an economical merit is given by-productively, which allows to decrease largely or to cut completely $H_2$ gas for reduction used in a conventional annealing process. In the Examples, an experimental furnace apparatus was used for plating, but it is possible to carry out by utilizing a ready-made equipment by improving a cooling step equipment partially for an actual continuous hot zinc dipping line.

Effect of the Invention

As mentioned above, in the method of plating steel according to the invention, since a plating Coat is formed on the steel surface after holding the steel material in an atmosphere of fluorine- or fluoride-containing gas in a heated condition, an oxide layer of the surface is removed and a fluoride layer is formed thereon to cover and protect the surface. The steel material with the fluoride film formed is dipped in a plating bath directly or introduced in an inert gas atmosphere containing hydrogen and heated to thereby decompose and remove the fluoride layer, and then dipped in the plating bath. In case of dipping in the plating bath directly, the fluoride film is decomposed and removed by an action of an added flux such as Chloride and Al added to the plating bath. In case of dipping in the plating bath after introducing the steel work into the hydrogen-containing inert gas atmosphere, since the fluoride layer is removed prior to dipping in the plating bath, the plating treatment can be done swiftly. In this way the fluoride layer is removed and an activated steel surface is exposed after being removed. Therefore, the plating coat is well-adhered and formed preferably on the activated steel surface to give a high quality plating.

What is claimed is:

1. A method of plating steel for forming a plating coat on steel works having an oxide layer on a surface thereof, comprising holding the steel works in an atmosphere of fluorine- or fluoride-containing gas at 300°–600° C., thereby removing said oxide layer and forming a fluorided layer on said steel works, and then forming an aluminum or zinc plating coat on the fluorided works.

2. A method of plating according to claim 1, wherein the fluorine- or fluoride-containing gas comprises an inert gas and at least one fluorine component selected from the group consisting of $NF_3$, $BF_3$, $CF_4$, $HF$, $SF_6$, $F_2$, $CH_2F_2$, $CH_3F$, $C_2F_6$, $WF_6$, $CHF_3$ and $SiF_4$.

* * * * *